United States Patent
Goth et al.

(10) Patent No.: US 7,362,839 B2
(45) Date of Patent: Apr. 22, 2008

(54) TECHNIQUES TO ADJUST VERTICAL OFFSET

(75) Inventors: Bjarke Goth, Roskilde Sj. (DK); Tore Sejr Joergensen, Taastrup (DK)

(73) Assignee: Intel Corporation, Santa Clara, CA (US)

( * ) Notice: Subject to any disclaimer, the term of this patent is extended or adjusted under 35 U.S.C. 154(b) by 682 days.

(21) Appl. No.: 10/863,664

(22) Filed: Jun. 7, 2004

(65) Prior Publication Data

US 2005/0271162 A1 Dec. 8, 2005

(51) Int. Cl.
*H04L 7/00* (2006.01)
(52) U.S. Cl. .................. 375/371; 341/68; 375/219
(58) Field of Classification Search ............ 375/371, 375/219, 317, 376; 324/763; 341/68
See application file for complete search history.

(56) References Cited

U.S. PATENT DOCUMENTS

| | | | |
|---|---|---|---|
| 6,002,723 A * | 12/1999 | Chethik | ......... 375/317 |
| 6,737,995 B2 * | 5/2004 | Ng et al. | ......... 341/68 |
| 6,885,209 B2 * | 4/2005 | Mak et al. | ......... 324/763 |
| 2003/0081667 A1 | 5/2003 | Camnitz et al. | |
| 2003/0193423 A1 | 10/2003 | Ng et al. | |
| 2004/0036494 A1 | 2/2004 | Mak et al. | |

OTHER PUBLICATIONS

Hansryd, Jonas et al., "Prescaled Clock Recovery Based on Small Timing Misalignment of Data Pulses," Journal of Lightwave Technology, vol. 19, No. 1, pp. 105-113, Jan. 2001.
European Patent Office, International Search Report and Written Opinion for International Application No. PCT/US2005/016555, 12 pages, Aug. 8, 2005.

* cited by examiner

*Primary Examiner*—Chieh M. Fan
*Assistant Examiner*—Jaison Joseph
(74) *Attorney, Agent, or Firm*—Caven & Aghevli LLC

(57) ABSTRACT

Techniques to modify bias levels of a limiting amplifier based on a transition measurement and measurements before and after the transition.

26 Claims, 4 Drawing Sheets

INPUT                    INPUT DATA

Offset = +50%

Offset = 0%

Offset = -50%

TECHNIQUES TO ADJUST VERTICAL OFFSET

DESCRIPTION OF RELATED ART

Jitter is the general term used to describe distortion caused by variation of a signal from its reference timing position in a communications system. In an ideal system, bits arrive at time increments that are integer multiples of a bit repetition time. In an operational system, however, pulses typically arrive at times that deviate from these integer multiples. This deviation may cause errors in the recovery of data, particularly when data is transmitted at high speeds. The deviation or variation may be in the amplitude, time, frequency or phase of this data. Jitter may be caused by a number of phenomena, including inter-symbol interference, frequency differences between the transmitter and receiver clock, noise, and the non-ideal behavior of the receiver and transmitter clock generation circuits.

Jitter is a problem of particular importance in digital communications systems for several reasons. First, jitter causes the received signal to be sampled at a non-optimal sampling point. This occurrence reduces the signal-to-noise ratio at the receiver and thus limits the information rate. Second, in operational systems, each receiver must extract its received sampling clock from the incoming data signal. Jitter makes this task significantly more difficult. Third, in long distance transmission systems, where multiple repeaters reside in the link, jitter accumulates. Accordingly, techniques to decrease jitter are needed.

BRIEF DESCRIPTION OF THE DRAWINGS

Note that use of the same reference numbers in different figures indicates the same or like elements.

DETAILED DESCRIPTION

Figure 1:
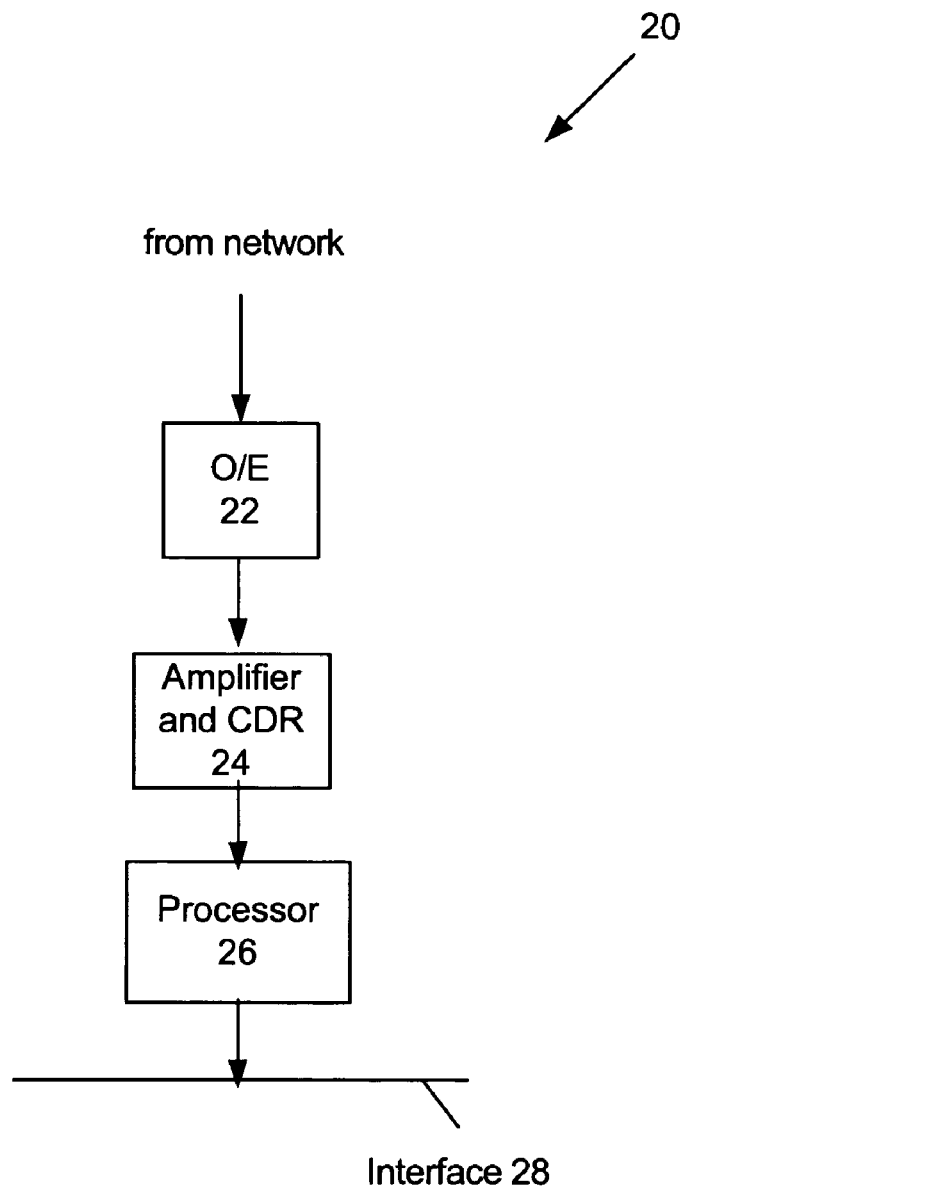
FIG. 1 depicts an implementation of a receiver system that can use embodiments of the present invention.

FIG. 1 depicts an implementation of a receiver system 20 that can use embodiments of the present invention. System 20 may include an optical-to-electrical signal converter (O/E) 22, amplifier and clock-and-data recovery device (CDR) 24, processor 26, and interface 28. O/E 22 may convert optical signals from an optical network to stable electrical signals. In some implementations, O/E 22 is not used and electrical signal are received from a network (e.g., gigabit Ethernet over copper).

Amplifier and CDR 24 may amplify an electrical format input signal and limit the amplitude of such input signal. Amplifier and CDR 24 may also remove jitter from such amplitude limited signals. Amplifier and CDR 24 may use some embodiments of the present invention.

Processor 26 may perform media access control (MAC) processing in compliance for example with Ethernet; optical transport network (OTN) de-framing and de-wrapping in compliance for example with ITU-T G.709; and/or forward error correction (FEC) processing in compliance for example with ITU-T G.975.

Interface 28 may provide intercommunication between processor 26 and other devices such as a memory device (not depicted), packet processor (not depicted), microprocessor (not depicted), and/or a switch fabric (not depicted). Interface 28 may comply with one or more of the following standards: Ten Gigabit Attachment Unit Interface (XAUI) (described in IEEE 802.3, IEEE 802.3ae, and related standards), Serial Peripheral Interface (SPI), I²C, universal serial bus (USB), IEEE 1394, Gigabit Media Independent Interface (GMII) (described in IEEE 802.3, IEEE 802.3ae, and related standards), Peripheral Component Interconnect (PCI), PCI Express, and/or ten bit interface (TBI).

In one implementation, components of receiver system 20 may be implemented among the same integrated circuit. In another implementation, components of receiver system 20 may be implemented among several integrated circuits that intercommunicate using, for example, a bus or conductive leads of a printed circuit board.

In communications systems that use limiting amplifiers (e.g., in amplifier and CDR 24), one cause of so-called pattern dependent jitter is a DC voltage differential between input terminals to the limiting amplifier (so called "vertical offset"). Vertical offset may cause asymmetry among peak voltages of a signal output by the limiting amplifier. Some embodiments of the present invention reduce pattern dependent jitter by reducing vertical offset.

Figure 2:
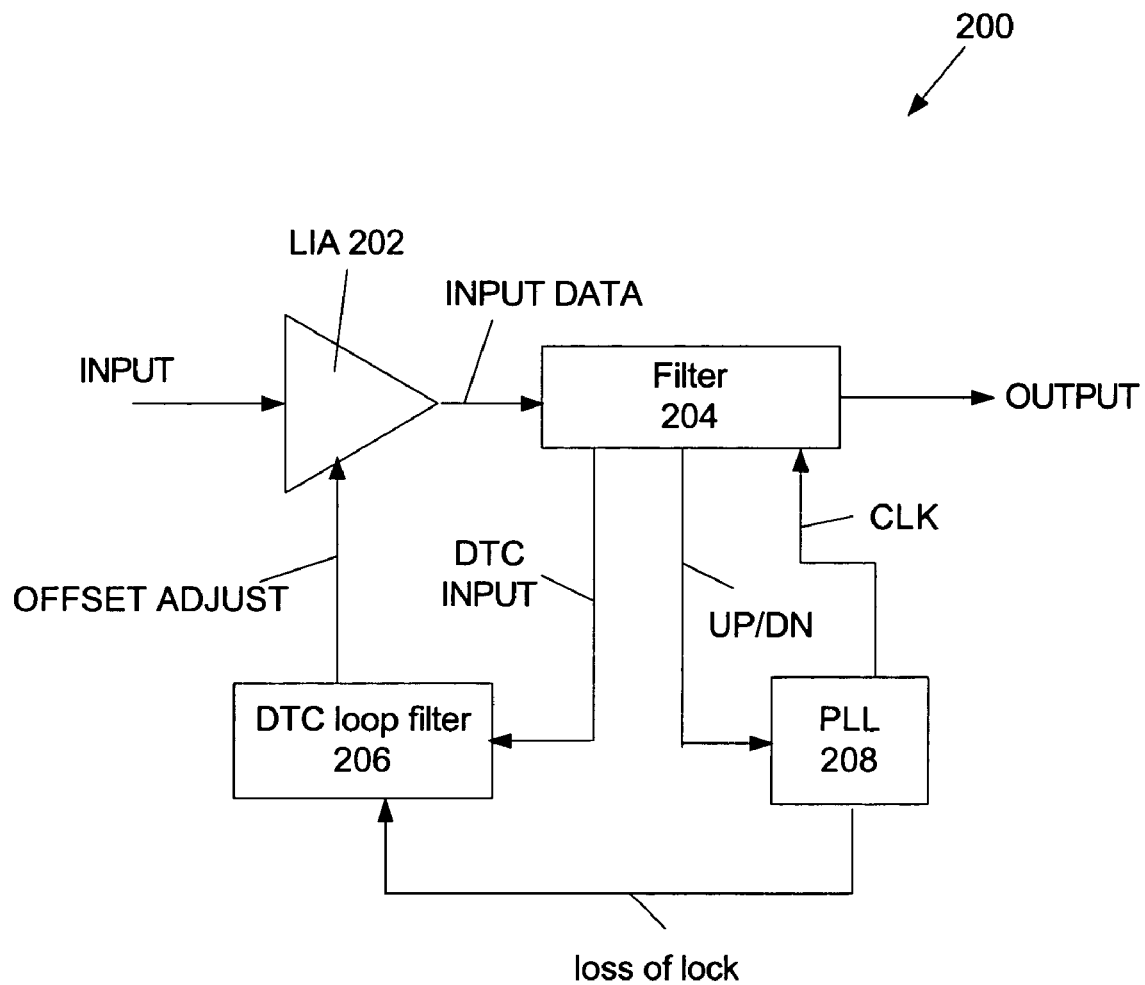
FIG. 2 depicts one embodiment of an amplifier and retiming device in accordance with an embodiment of the present invention.

FIG. 2 depicts one embodiment of an amplifier and retiming device 200, in accordance with an embodiment of the present invention, although other implementations may be used. For example, amplifier and CDR 24 may utilize amplifier and retiming device 200. One embodiment of amplifier and retiming device 200 may include a limiting amplifier (LIA) 202, filter 204, DTC loop filter 206, and phase locked loop (PLL) 208.

Limiting amp (LIA) 202 may amplify an input signal (signal INPUT) and limit the amplitude of the amplified signal. LIA 202 may provide signal INPUT DATA as the amplitude limited amplified signal.

Filter 204 may output samples of signal INPUT DATA timed to clock signal CLK (shown as signal OUTPUT). Filter 204 may output a phase difference signal (shown as UP/DN) that represents whether a transition of the signal INPUT DATA leads or lags that of signal CLK. Filter 204 may be implemented using an Alexander (bang-bang) type phase detector. For example, the chart below provides an example manner by which filter 204 determines UP/DN signals.

Filter 204 may also provide an input signal to DTC loop filter 206 (shown as signal DTC INPUT) to control the input bias point of the LIA 202. The signal DTC INPUT may be based on measurements of the signal INPUT DATA at a transition point and before and after the transition point. In one implementation, filter 204 uses a threshold value to determine the measurements of the signal INPUT DATA at the transition point and before and after the transition point. For example, the following chart provides an example manner to determine the signal DTC INPUT as well as values of UP/DN signals.

| D' | T | D | Value of UP/DN | Signal DTC INPUT |
|---|---|---|---|---|
| 0 | 1 or 0 | 0 | Tristate (no output) | Tristate (no output) |
| 0 | 0 | 1 | UP | Down |
| 0 | 1 | 1 | DN | Up |
| 1 | 0 | 0 | DN | Down |
| 1 | 1 | 0 | UP | Up |
| 1 | 1 or 0 | 1 | Tristate (no output) | Tristate (no output) | where:
- D' is a measurement of signal INPUT DATA before the transition, T, based on a filter decision threshold;
- D is a measurement of signal INPUT DATA after transition, T, based on a filter decision threshold; and
- T is a measurement of signal INPUT DATA based on a filter decision threshold.

In one implementation, the value D' may be the value of signal INPUT DATA immediately prior to the transition at T whereas the value D may be the value of signal INPUT DATA immediately after the transition at T.

DTC loop filter 206 may adjust the input terminal bias voltage of LIA 202 using signal OFFSET ADJUST and based on signal DTC INPUT. Accordingly, one advantage, but not a necessary feature of some embodiments of the present invention is the pattern jitter may be reduced by adjusting the vertical offset of the input terminals to the LIA 202. DTC loop filter 206 may average the signal DTC INPUT from filter 204 over time. Based on the average of the signal DTC INPUT from filter 204 over a selected period of time, DTC loop filter 206 may adjust the magnitude of signal OFFSET ADJUST.

For example, a "Down" value of signal DTC INPUT causes the DTC loop filter 206 to lower the magnitude of signal OFFSET ADJUST provided to the LIA 202. Decreasing the magnitude of signal OFFSET ADJUST decreases the bias point of the input terminals to the LIA 202. For example, an "Up" value of signal DTC INPUT causes the DTC loop filter 206 to increase the magnitude of signal OFFSET ADJUST provided to the LIA 202. Increasing the magnitude of signal OFFSET ADJUST increases the bias point of the input terminals to the LIA 202. For example, over a selected period of time, if $2/3$ of signal DTC INPUT are "Down" and $1/3$ are "Up", then the signal OFFSET ADJUST may be $1/3$ of its maximum value.

Figure 3:
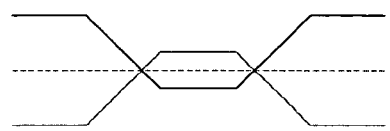
FIG. 3 depicts an example of a signal with no applied offset compensation as well as a signal with applied offset compensation.
Figure 3:
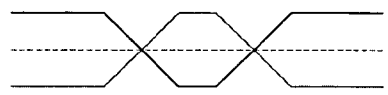
Figure 3:
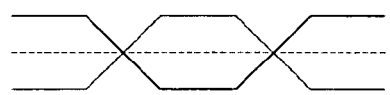
Figure 3:
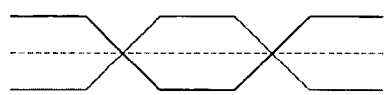
Figure 3:
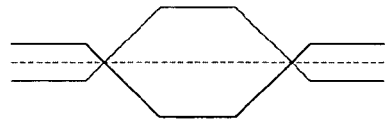
Figure 3:
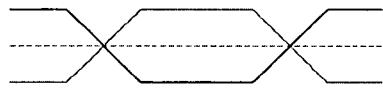

For example, the left side of FIG. 3 depicts an example of signal INPUT transmitted to LIA 202 with different vertical offset conditions but no vertical offset compensation. The right side of FIG. 3 depicts an example of the corresponding signal INPUT DATA to each INPUT signal. The example clearly shows how vertical offset is translated into a phase/duty cycle error and how no offset does not translate into phase/duty cycle error. In accordance with embodiments of the present invention, vertical offset adjustment cancels offset before propagation through LIA 202.

Figure 4:
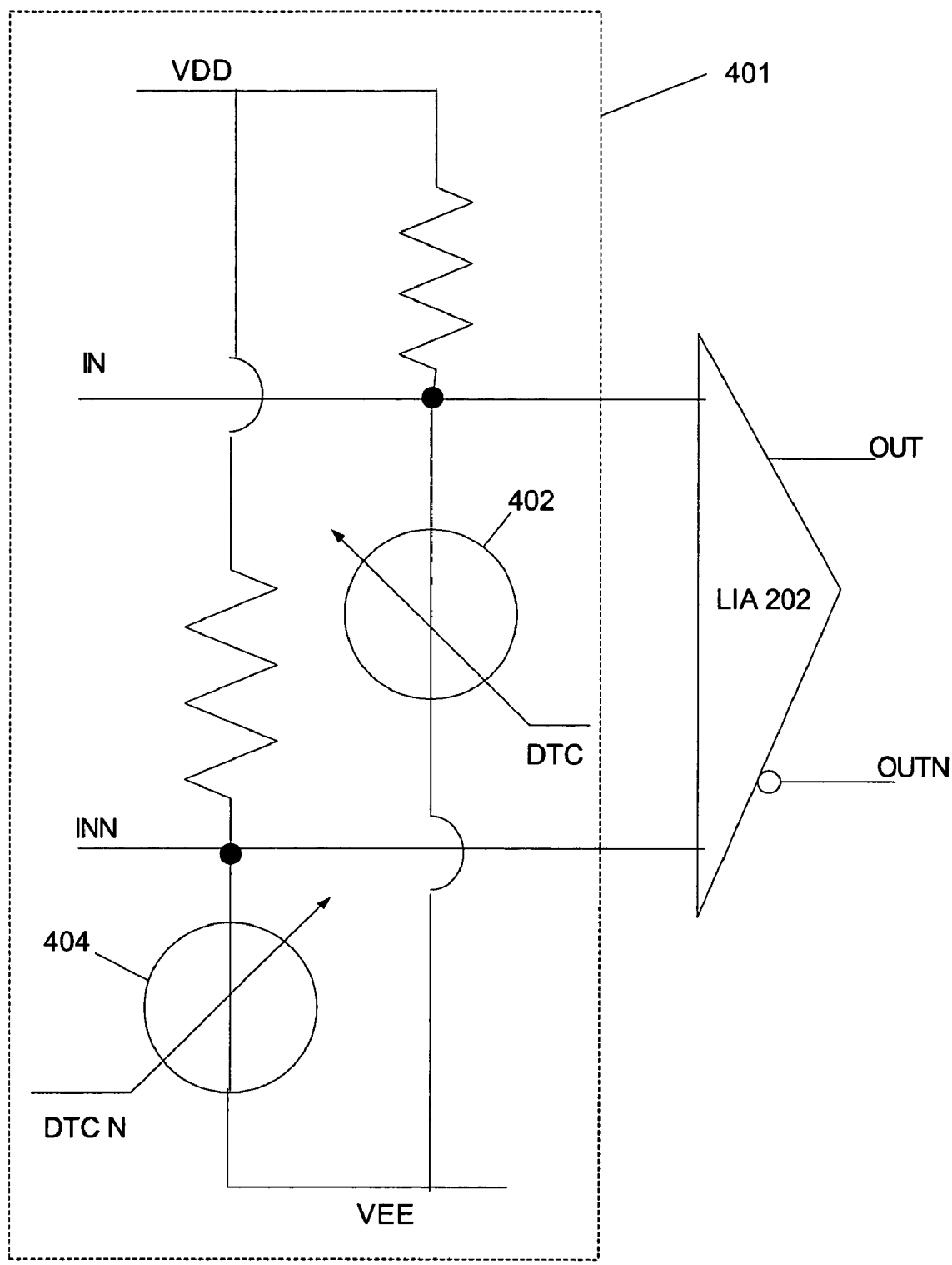
FIG. 4 depicts an example implementation of a threshold adjustment device, in accordance with an embodiment of the present invention.

For example, FIG. 4 depicts an example implementation of a threshold adjustment device 401, in accordance with an embodiment of the present invention, although other implementations may be used. In this example, threshold adjustment device 401 adjusts the bias of terminals IN and INN to reduce vertical offset imparted to a differential input signal provided to terminals IN and INN. Threshold adjustment device 401 provides the vertical offset adjusted input signal as an input to LIA 202. In this example, LIA 202 provides differential output signal at terminals OUT and OUTN.

Threshold adjustment device 401 may include controllable current sources 402 and 404 controlled at respective terminals DTC and DTCN by a differential form of signal OFFSET ADJUST from DTC loop filter 206. For example, if signal OFFSET ADJUST is at $1/3$ of a maximum then current source 402 may provide $1/3$ of a total current among current sources 402 and 404 and current source 404 may provide $2/3$ of the total current.

If an applied offset to input terminal bias voltage of LIA 202 is larger than the amplitude of the signal INPUT, clipping of signal INPUT may result. In one implementation, to prevent an offset of the input terminal bias voltage of LIA 202 from being larger than the amplitude of the signal INPUT, an amplitude window for the signal OFFSET ADJUST may be set. In the event the amplitude or magnitude of the signal OFFSET ADJUST exceeds the window range, the DTC loop filter 206 may be reset. For example, when the DTC loop filter 206 has differential inputs, one manner to reset the DTC loop filter 206 is to short the differential inputs of the DTC loop filter 206. For example, when the DTC loop filter 206 has a single ended input, one manner to reset the DTC loop filter 206 is to set to zero the input to the DTC loop filter 206.

In one implementation, to prevent an applied offset of the input terminal bias voltage of LIA 202 from being larger than the amplitude of the signal INPUT, the amplitude of signal OFFSET ADJUST may be limited to less than one hundred percent (100%) of the peak amplitude of the signal INPUT.

In one implementation, a charge pump of DTC filter 206 regulates its output current to keep constant a loop gain of a loop including LIA 202, filter 204, and DTC filter 206. For example, if an input signal of small amplitude is provided to the charge pump, then the output current from the charge pump is low. Conversely, if an input signal of large amplitude is provided to the charge pump, then the output current from the charge pump is high. For example, a peak detector may be utilized to control the output current from the charge pump based on the amplitude of the input signal to the charge pump.

PLL 208 may output clock signal CLK. The frequency of signal CLK may be approximately the same as that of signal INPUT DATA. PLL 208 may adjust the phase of clock signal CLK based on phase comparisons (e.g., UP/DN) from filter 204. One implementation of PLL 208 may include a charge pump (not depicted), loop filter (not depicted), and oscillator (not depicted).

In one implementation, PLL 208 provides a lock signal which indicates whether signal CLK approximately tracks signal INPUT DATA. If the lock signal indicates that the PLL 208 is out of lock (i.e., signal CLK does not track signal INPUT DATA), then the DTC loop filter 206 may be reset by shorting differential inputs or zeroing an input to DTC loop filter 206.

The drawings and the forgoing description gave examples of the present invention. While a demarcation between operations of elements in examples herein is provided, operations of one element may be performed by one or more other elements. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:
1. A method comprising:

measuring a first value of an input signal at a first time based on a threshold and a clock signal;

measuring a second value of the input signal at a second time based on the threshold and the clock signal;

measuring a third value of the input signal at a third time based on the threshold and the clock signal;

selectively adjusting vertical offset of a limiting amplifier based on the first, second and third values by a loop filter; and transmitting a loss of lock signal to the loop filter directly from a phase locked loop that is to generate the clock signal, wherein at least one input of the loop filter is to be reset in response to an indication by the loss of lock signal that the input signal and the clock signal are out of lock.

2. The method of claim 1, further comprising providing the first, second and third values using a bang-bang filter.

3. The method of claim 1, wherein the second value comprises a transition value.

4. The method of claim 1, wherein the adjusting comprises:

decreasing the vertical offset in response to the second value being zero and the first and third values being different.

5. The method of claim 1, wherein the adjusting comprises:

increasing the vertical offset in response to the second value being one and the first and third values being different.

6. The method of claim 1, further comprising:

providing approximately zero input offset to the limiting amplifier in response to the clock signal and the input signal being out of lock with each other.

7. The method of claim 1, wherein the first time precedes the second time and wherein the third time follows the second time.

8. The method of claim 1, wherein measuring the first, second and third values comprises using a bang-bang filter and wherein selectively adjusting vertical offset comprises selectively adjusting vertical offset using a loop filter based on the first, second and third values and further comprising maintaining a constant loop gain of a loop comprising the limiting amplifier, the bang-bang filter, and the loop filter.

9. An apparatus comprising:

a filter to provide a bias adjustment signal based on measurements of an input signal;

a limiting amplifier to provide the input signal to the filter;

a decision threshold adjusting device to adjust a bias level of the limiting amplifier based on the bias adjustment signal; and a phase locked loop to provide a clock signal to the filter and a loss of lock signal directly to the decision threshold adjusting device, wherein at least one input of the decision threshold adjusting device is to be reset in response to an indication by the loss of lock signal that the input signal and the clock signal are out of lock.

10. The apparatus of claim 9, wherein the filter provides phase comparisons between the input signal and the clock signal and wherein the phase locked loop adjusts a phase of the clock signal based on the phase comparisons.

11. The apparatus of claim 9, wherein the measurements comprise at least three measurements of the input signal based on the clock signal and a threshold.

12. The apparatus of claim 11, wherein a second measurement comprises a transition value.

13. The apparatus of claim 11, wherein the decision threshold adjusting device is to decrease the bias level in response to the second measurement equaling zero and the first and third measurements being different.

14. The apparatus of claim 11, wherein the decision threshold adjusting device is to increase the bias level in response to the second measurement equaling one and the first and third measurements being different.

15. The apparatus of claim 11, wherein the decision threshold adjusting device is to provide approximately zero bias adjustment to the limiting amplifier in response to the clock signal being out of lock with the input signal.

16. The apparatus of claim 9, further comprising a bang-bang filter to provide the measurements of the input signal, wherein the filter provides a signal to maintain a constant loop gain of a loop comprising the bang-bang filter, the filter, decision threshold adjusting device, and limiting amplifier.

17. A system comprising:

a retimer system comprising:

a filter to provide a bias adjustment signal based on measurements of an input signal, a limiting amplifier to provide the input signal to the filter, a decision threshold adjusting device to adjust a bias level of the limiting amplifier based on the bias adjustment signal, and a phase locked loop to provide a clock signal to the filter and a loss of lock signal directly to the decision threshold adjusting device, wherein at least one input of the decision threshold adjusting device is to be reset in response to an indication by the loss of lock signal that the input signal and the clock signal are out of lock; and a data processor to receive samples of the input signal from the retimer system; and an interface to exchange signals with the data processor.

18. The system of claim 17, wherein the data processor is to perform media access control in compliance with IEEE 802.3.

19. The system of claim 17, wherein the data processor is to perform optical transport network de-framing in compliance with ITU-T G.709.

20. The system of claim 17, wherein the data processor is to perform forward error correction processing in compliance with ITU-T G.975.

21. The system of claim 17, wherein the interface is compatible with XAUI.

22. The system of claim 17, wherein the interface is compatible with PCI.

23. The system of claim 17, wherein the interface is compatible with PCI Express.

24. The system of claim 17, further comprising a switch fabric operatively responsive to the interface.

25. The system of claim 17, further comprising a packet processor operatively responsive to the interface.

26. The system of claim 17, further comprising a memory device operatively responsive to the interface.

* * * * *